(12) United States Patent
Kruke et al.

(10) Patent No.: US 6,734,357 B2
(45) Date of Patent: May 11, 2004

(54) MODULAR CONTROL CASING

(75) Inventors: Nicole Kruke, Lübbecke (DE); Martin Schmidt, Lübbecke (DE); Hartmut Schwettmann, Rahden (DE); Uwe Sundermeier, Espelkamp (DE)

(73) Assignee: Harting Electric GmbH & Co. KG (DE)

( * ) Notice: Subject to any disclaimer, the term of this patent is extended or adjusted under 35 U.S.C. 154(b) by 0 days.

(21) Appl. No.: 10/307,758

(22) Filed: Dec. 2, 2002

(65) Prior Publication Data

US 2003/0136574 A1 Jul. 24, 2003

(30) Foreign Application Priority Data

Jan. 18, 2002 (DE) ..................................... 202 00 720 U

(51) Int. Cl.[7] ............................................... H01R 13/46
(52) U.S. Cl. ........................... 174/59; 174/50; 174/17 R
(58) Field of Search ....................... 174/59, 50, 17 R, 174/58, 63; 220/4.02; 439/535; 248/906

(56) References Cited

U.S. PATENT DOCUMENTS 5,613,237 A * 3/1997 Bent et al. ................... 455/351

FOREIGN PATENT DOCUMENTS

| DE | 43 24 913 C1 | 7/1993 | ............ H05K/5/06 |
|----|--------------|--------|-----------------------|
| DE | 44 16 004 C1 | 5/1994 | ............ H05K/5/02 |
| DE | 196 46 481 C2 | 11/1996 | ............ H05K/5/00 |
| DE | 200 05 084 U1 | 3/2000 | ............ H05K/5/00 |

* cited by examiner

*Primary Examiner*—Dean A. Reichard
*Assistant Examiner*—Jinhee Lee
(74) *Attorney, Agent, or Firm*—Hayes Soloway P.C.

(57) ABSTRACT

A modular-construction control casing for the integration of plug-in connectors and additional electronic equipment within an electronic casing which is located, in a decentralized manner, close to the consumer's installation. The rectangular parallelepiped-shaped casing is formed from two identical half-shells, at least one mounting plate or printed-circuit board being mountable within the casing. Provided at the narrow sides of the casing are openings which can receive either a plate part for the closure of the casing and/or for the mounting of control elements, or into which there can be inserted, with a form-fit, an adapter which is provided for receiving already known plug-in connectors.

8 Claims, 5 Drawing Sheets

MODULAR CONTROL CASING

The invention relates to a modular control casing, particularly a casing having the form of a rectangular parallelepiped, assembled from two homogeneous casing shells which can be joined together.

Such a modular-construction casing is required in order to bring electronic control elements, status displays or other components, together with one or more plug-in connections, directly to the load, in a decentralized manner, in an industrial environment.

Known in industrial applications is the practice of housing electronic components for controlling motors and sensors predominantly in metal casings, in order to protect them from human contact and from the corrosive industrial atmosphere.

Also known, moreover, is the practice of producing casings, predominantly made from plastics, from half-shells which can be joined together, these casings being provided to receive electronic equipment and being sometimes used for cordless operation and sometimes as cabled adapter casings.

Disadvantages of such casings, however, are that for the most part they cannot be used in a harsh industrial environment and that, with only one casing version, variable application is not possible.

The object of the invention, therefore, is to develop a modular-construction control casing of the initially indicated type such that the casing can be used for industrial application with heavy-duty plug-in connectors, while at the same time providing for control or display possibilities by means of integrated electronic equipment.

This object is achieved in that there are provided in the corner regions of the casing shells angles (or angled portions), formed-on perpendicularly to the casing shell, whose end faces abut upon assembly of the casing shells, in that inner posts (or post portions), separated from the angles, are provided in the corner regions, the posts being shortened relative to the angles, in that in the casing shells a circumferential groove is formed which runs between the angles and the posts, in that a single-piece, elastic seal with a sealing profile can be inserted in the circumferential groove, in that end pieces (or corner pieces), formed onto the seal, project between the separated angles and posts, and in that formed-on pieces provided on the end pieces bear on top faces of the posts.

The advantages achieved by the invention consist particularly in that the modular-construction control casing renders possible a variable construction of a casing suitable for industrial application in which electronic equipment can be installed, in the context of decentralization of control tasks towards the consumer's installation, with, at the same time, one or more plug-in connectors being mountable in appropriate adapters on the control casing.

The control casing consists essentially of two half-shells which can be joined together by means of posts, formed out of the half-shells, and screws which are let into the posts.

All four narrow sides of the rectangular parallelepiped casing are provided with openings, produced between the posts, in which either a plate part, for the closure of the respective side, or an adapter, for receiving, for example, plug-in connectors, can be inserted.

The plate parts are advantageously provided, at their narrow sides, with bevels running out from the centre to the edges, so that they can be firmly inserted in the opening of the casing, the opening being provided with a circumferential groove.

In addition, mounting plates or printed-circuit boards can be mounted on base-type supports inside the casing.

The use of a circumferential rubber seal advantageously provides for a dust-tight and splashwater-tight casing, with a protection rating of up to IP 65, for use in a harsh industrial environment.

In addition, such a casing can also be attached to DIN mounting rails within switchgear cabinets, or can be otherwise optionally mounted.

An embodiment example of the invention is explained more fully in the following and represented in the drawing, wherein:

FIG. 1 shows a perspective view of a complete control casing 1 according to the invention, with a visibly represented plug-in connector.

Joined to the casing, which is formed from two casing halves 2, 3, are two adapters 10, 10' and two plate parts 20, only one of which, however, is visible. A plug-in connector 18' is inserted within the smaller adapter 10'.

Figure 1:
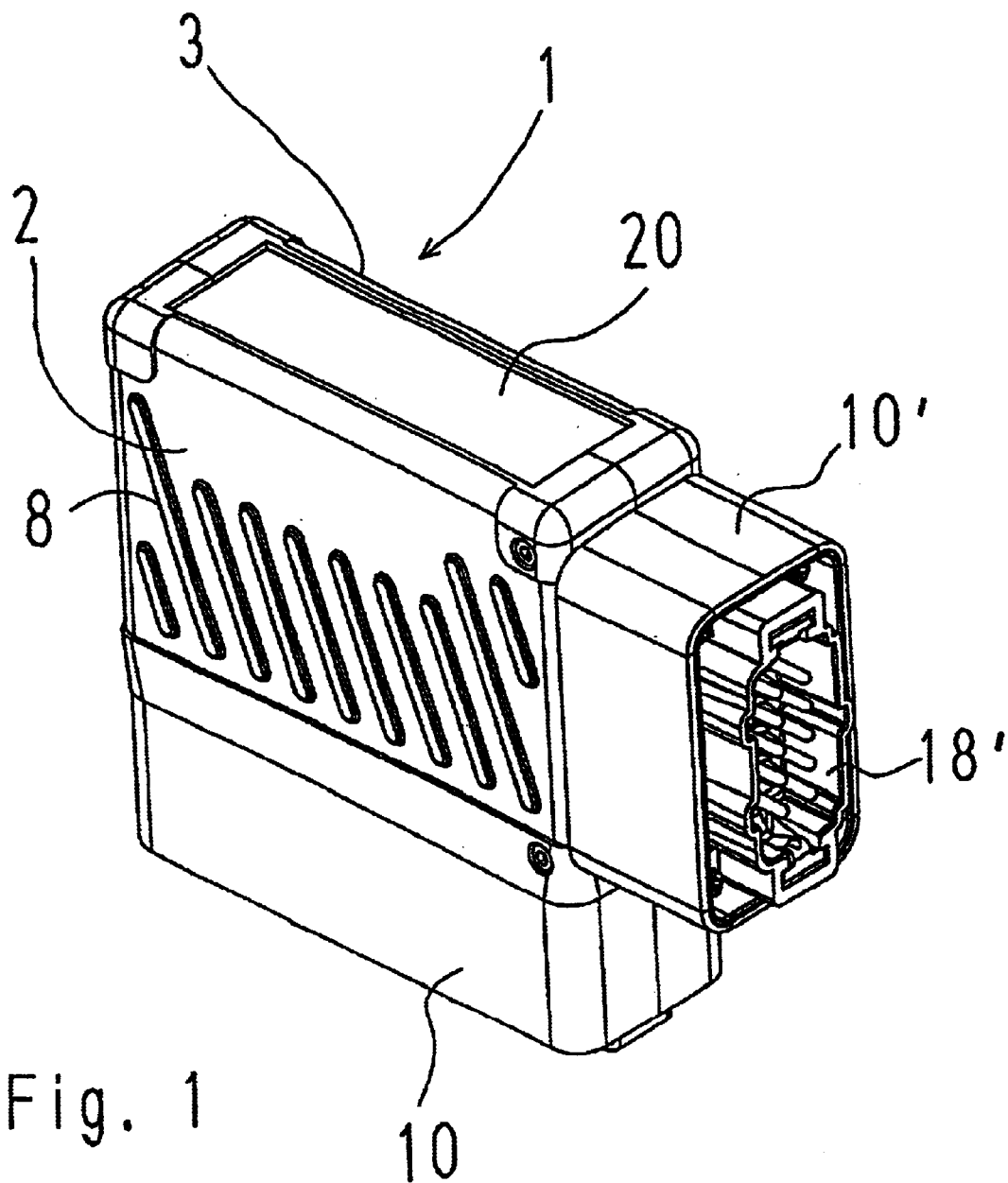
FIG. 1 shows a perspective view of a complete control casing.
Figure 2:
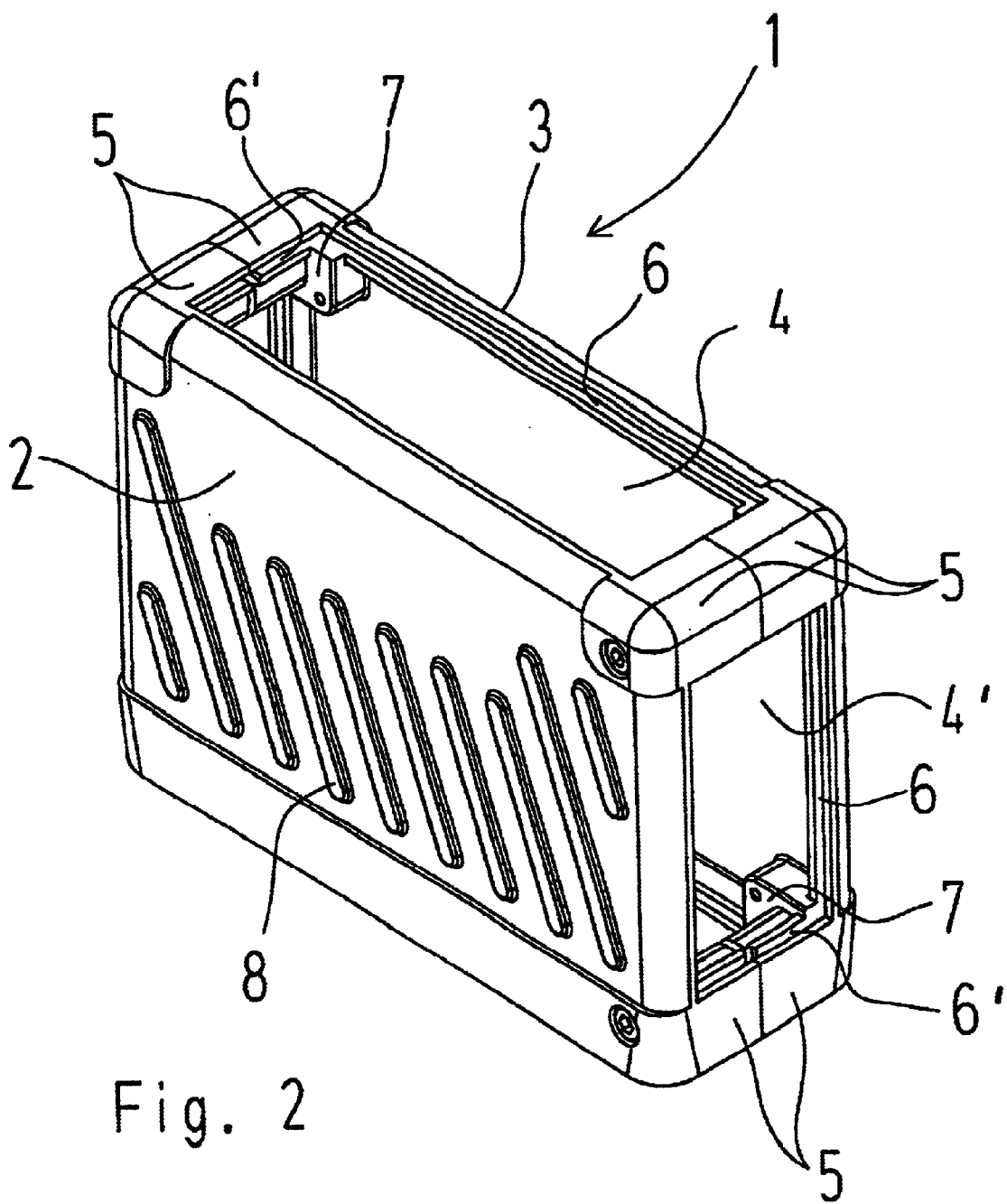
FIG. 2 shows a control casing formed from two casing shells.

FIG. 2 shows a perspective representation of the two joined casing halves 2, 3, which are held together by formed-on angles (or angled portions) 5 at each of the corner regions and by means of screwed connections integrated therein.

Formed between the angles are recesses 4, 4', which respectively comprise a circumferential groove 6, 6' in their inner rims.

Respectively provided in the corner regions of the casing halves are supports 7, for the attachment of a printed-circuit board or a mounting plate inside the casing. The outer face of the casing halves is provided with obliquely disposed profile strips 8, in order to offer a firm gripping surface for the removal of a casing 1 equipped with a plug-in connector.

Figure 3:
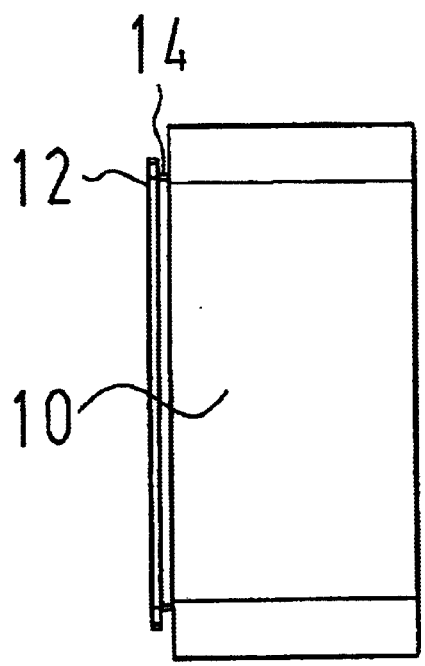
FIG. 3 shows a side view of an adapter.

FIG. 3 shows a side view of an adapter 10, a profile being identifiable which is formed from a collar 12 and a necessarily resultant groove 14. Upon its installation, the adapter is inserted in one of the recesses 4, 4' of the casing 1, with the collar 12 being inserted in the groove 6, 6'.

Figure 4:
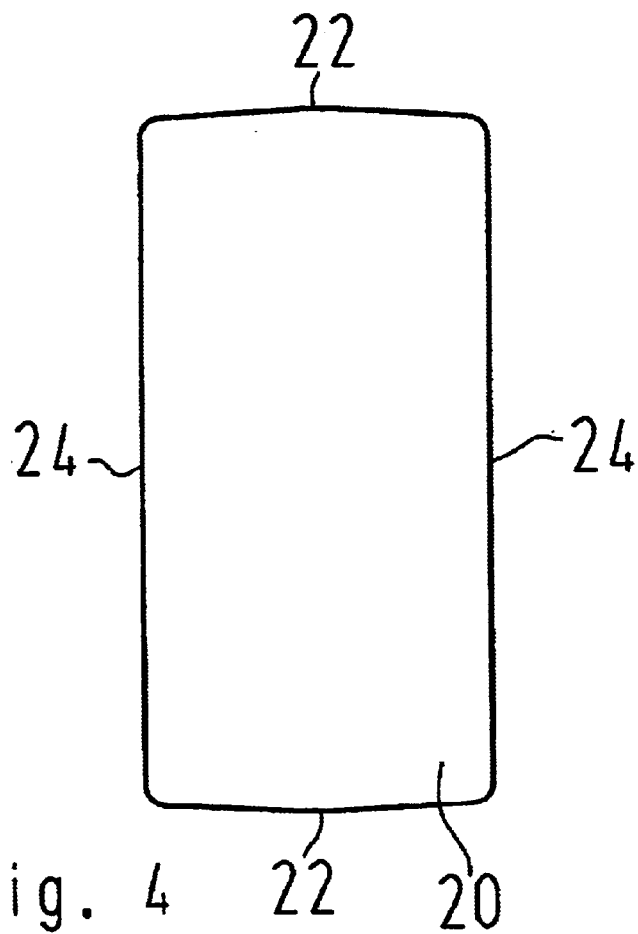
FIG. 4 shows a top view of a plate part.

In its outer contour, the collar 12 has the same form as the plate part 20 shown in FIG. 4.

The plate part, which likewise has a rectangular form, is provided, at its narrow sides, with a symmetrical bevel which runs from the plate center 22 out to the edges 24.

The greater length of the plate centre relative to the edges effects an invariably secure, fixed and non-canted joint between the casing shells and both the plate parts and the inserted adapters.

Figure 5:
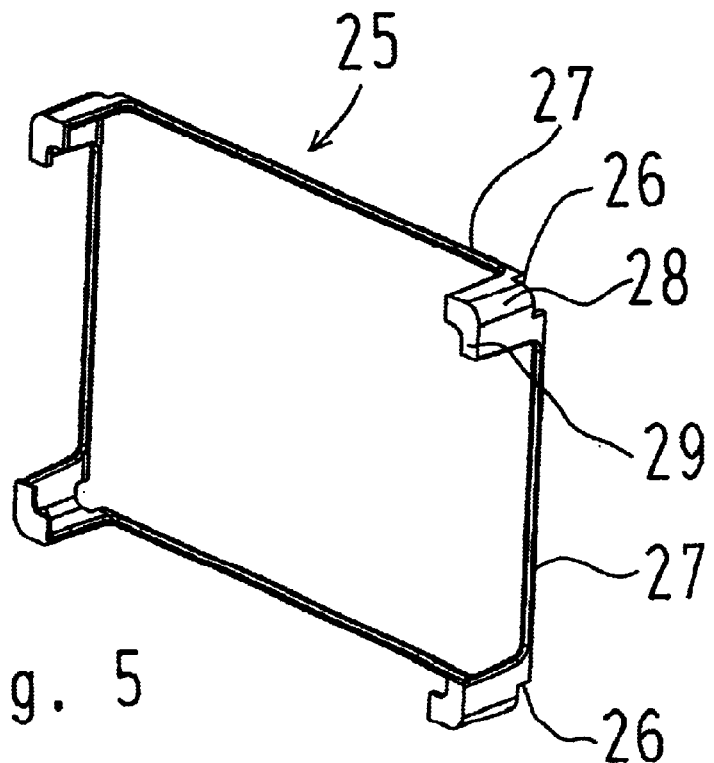
FIG. 5 shows a perspective representation of a seal.

FIG. 5 shows a single-part seal 25 which is provided for insertion in the circumferential groove 6, 6' in the casing shells 2, 3. Compared with a normal rubber seal, which is circular in form and may have different cross-sections, this seal has a particularity in that perpendicularly projecting, angular corner pieces 28 with a plate piece 29, are provided in the corner points of the sealing profile 27.

Additionally provided in each of the corner pieces is a recess 26, of a depth of at least the thickness of the sealing profile 27, with which a precisely fitting location of the seal is achieved through a corresponding mating form in the corner region of the circumferential groove 6 in the casing shell.

When a seal is inserted in respectively one of the two casing shells 2, 3, not only is the respective groove 6, 6' filled with the sealing profile 27, but the posts 5' (or post portions), described more fully with reference to FIG. 6, are also covered.

Each of the two casing shells thus has a separate circumferential seal which, in turn, upon assembly of the two casing shells, produces a circumferential seal in each of the recesses 4, 4' and results in a watertight casing using only the inserted plates.

Figure 6A:
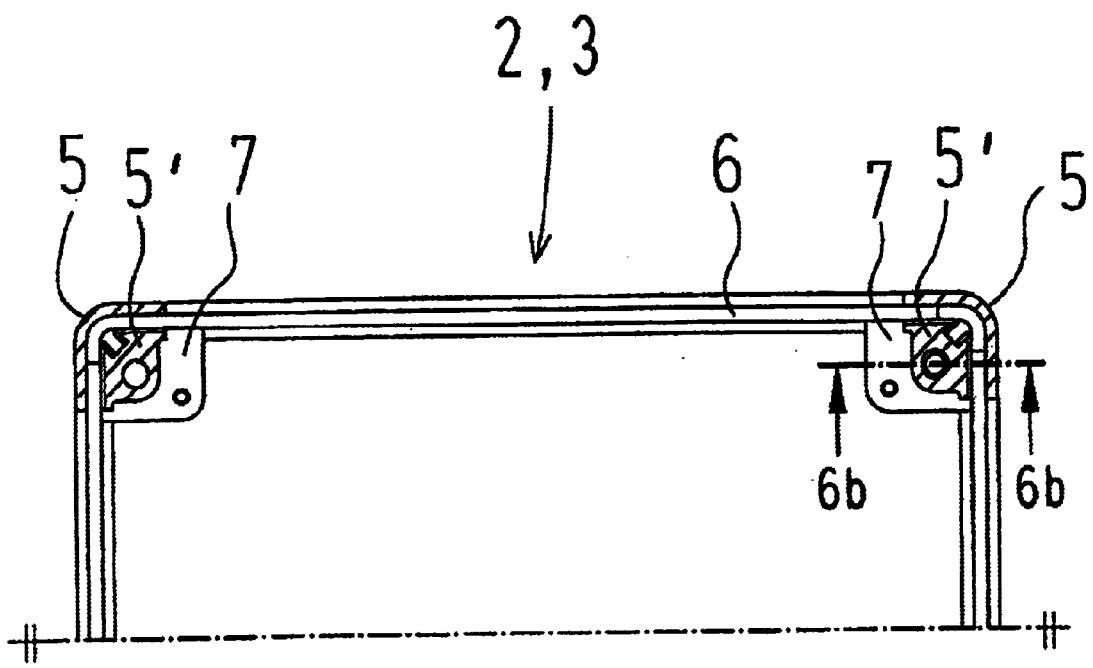
FIG. 6a shows a top view of the inside of a casing shell.
Figure 6B:
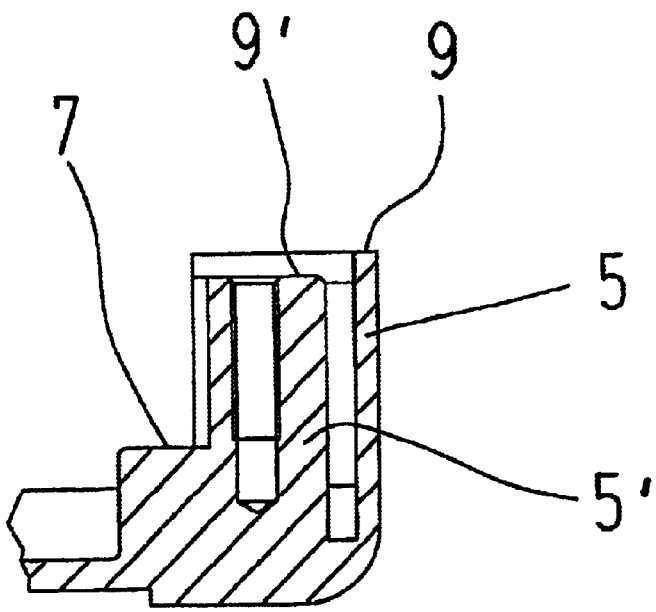
FIG. 6b shows a partial section of a corner region of the casing shell.

FIGS. 6a and 6b show, in a top view and in a detail section respectively, the inside of an open casing shell 2, 3 and details of the corner regions.

The angle 5 is provided with the end face 9 for the mutual support of the casing shells and, in the example, is rounded as a part visible from the outside. Although, with the internal post 5', the angle 5 is jointly formed onto the casing shell, it is nevertheless for the most part separated by a slot through which the circumferential groove 6 for the sealing profile of the seal 25 is routed. Upon assembly of the casing, a shell-shaped corner piece 28 of the seal 25 is pushed into this slot in each case, the plate piece 29 bearing, at least partially, on the end face of the post 5'.

In order to ensure that, upon assembly, the casing shells are tightly fitted together, the length of the inner post 5' is shortened relative to the angle 5, so that sufficient space remains for the plate piece 29 of the seal bearing on the end face 9' (see, in this connection, FIG. 6b).

Also provided on the end face 9' of the post 5' is a bore, not indicated further here, for the mutual screwed fastening of the two casing shells 2, 3.

Figure 7:
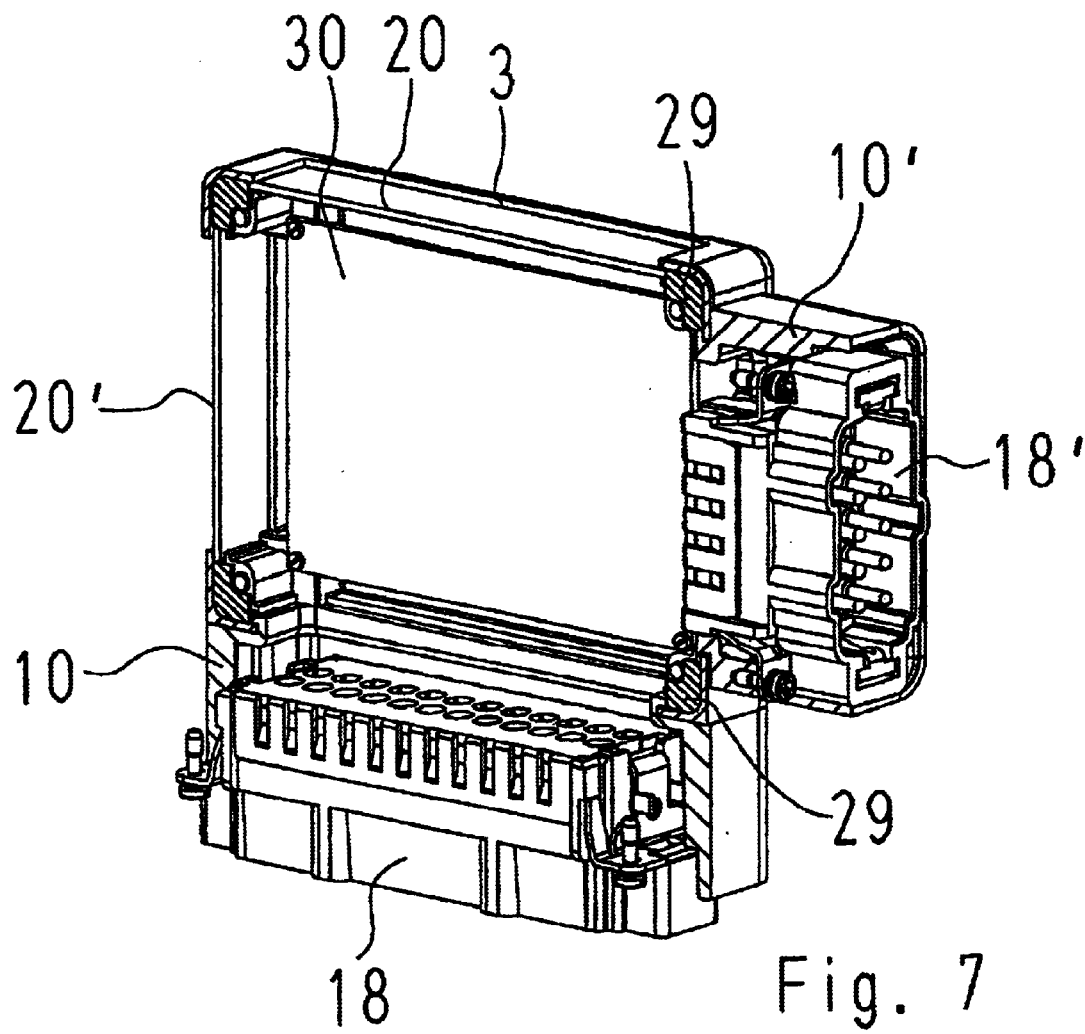
FIG. 7 shows a view of an opened control casing.

FIG. 7 shows an opened casing from which the upper casing shell has been removed, two adapters 10, 10' and two plate parts 20, 20' being inserted at one of the narrow sides.

Respectively suitable plug-in connectors 18, 18' are inserted in the adapters. Additionally shown in the casing half is a mounting plate 30 (or a printed-circuit board), on which electrical and/or electronic components can be mounted. Similarly, the plate parts 20, 20' can be provided with display or switching means.

As additionally indicated by FIG. 7, the application, in respect of the adapters and the plate parts, in which a total of four lateral openings are optionally formed, can from a casing completely enclosed by plate parts to a fourfold plug connector, a dust-tight and splashwater-tight casing design being possible with use of the seal 25 described above with reference to FIG. 5.

What is claimed is:

1. A modular control casing comprising:

two casing shell halves, each shell half having at least two corner regions and end faces, said end faces of one shell half contacting the end faces of the other shell half when said casing shell halves are joined to form a single casing shell;

angled portions located in said corner regions;

post portions located in said corner regions in areas separate from said angled portions, said post portions being shorter than said angled portions;

a circumferential groove formed in each of said casing shell halves, said groove extending between said angled portions and said post portions of said corner regions; and a single-piece elastic seal fitting in said groove, said seal being pre-formed with corner pieces and plate pieces, said corner pieces fitting between said post portions and said angled portions and said plate piece covering said post portions when said seal is disposed in said groove, wherein said single casing shell is substantially rectangular parallelopiped in shape.

2. Modular control casing according to claim 1, characterized in that a second groove, which meets the circumferential groove perpendicularly, is provided between said second angles and said end face of each shell half.

3. Modular control casing according to claim 1, characterized in that said casing is provided with openings into which at least one adapter with electrical connection elements inserted therein, may be inserted in openings of said casing.

4. Modular control casing according to claim 3, characterized in that the electrical connection elements which can be inserted in the adapter are in the form of plug-in connectors.

5. Modular control casing according to claim 1, characterized in that the adapter is provided with a circumferential collar which engages in said circumferential groove.

6. Modular control casing according to claim 1, characterized in that a plate part of rectangular shape is inserted in said circumferential groove of said casing, the plate part having narrow sides, said sides having bevels which run from the center out to the edges.

7. Modular control casing according to claim 1, characterized in that the casing is provided with a base support to which at least one mounting plate or printed circuit board may be mounted.

8. Modular control casing according to claim 1, characterized in that the outer face of the casing shell is provided with raised profile strips.

* * * * *